United States Patent [19]

Schiltz et al.

[11] Patent Number: 5,234,539

[45] Date of Patent: Aug. 10, 1993

[54] MECHANICAL LIFT-OFF PROCESS OF A METAL LAYER ON A POLYMER

[75] Inventors: André Schiltz; Jean Palleau, both of Meylan; Joaquim Torres, Saint Martin le Vinoux, all of France

[73] Assignee: France Telecom (C.N.E.T.), Paris, France

[21] Appl. No.: 944,732

[22] Filed: Sep. 14, 1992

Related U.S. Application Data

[63] Continuation of Ser. No. 658,633, Feb. 22, 1991, abandoned.

[30] Foreign Application Priority Data

Feb. 23, 1990 [FR] France ................................. 90 02690

[51] Int. Cl.⁵ ...................... H01L 21/306; B44C 1/22; C23F 1/00; B29C 37/00
[52] U.S. Cl. ..................................... 156/645; 156/630; 156/634; 156/655; 156/656; 156/659.1; 156/668; 156/902
[58] Field of Search ............... 156/630, 633, 634, 645, 156/655, 656, 659.1, 664, 668, 902, 661.1, 344; 430/314, 315, 317, 318; 29/846, 848; 427/96, 98, 99, 349

[56] References Cited

U.S. PATENT DOCUMENTS

| | | |
|---|---|---|
| 3,537,925 | 11/1970 | Chen .................................. 156/659.1 |
| 3,873,361 | 3/1975 | Franco et al. ..................... 427/259 X |
| 4,004,044 | 1/1977 | Franco et al. .......................... 427/43 |
| 4,119,483 | 10/1978 | Hubsch et al. ................... 156/668 X |
| 4,328,263 | 12/1981 | Karahashi et al. ..................... 427/93 |
| 4,448,636 | 5/1984 | Baber ................................... 156/643 |
| 4,662,989 | 5/1987 | Casey et al. .......................... 156/655 |
| 4,670,090 | 6/1987 | Sheng et al. ................... 156/661.1 X |
| 4,845,046 | 7/1989 | Shimbo ................................... 437/41 |
| 4,871,651 | 10/1989 | McCune, Jr. et al. ............... 430/315 |
| 5,045,150 | 9/1991 | Cleeves et al. ........................ 156/643 |

FOREIGN PATENT DOCUMENTS

0025261A1 12/1981 European Pat. Off. .

OTHER PUBLICATIONS

Patent Abstracts of Japan, vol. 8, No. 228, Yokota, 1984 JP-A-59-107354(a).

*Primary Examiner*—William A. Powell
*Attorney, Agent, or Firm*—Lowe, Price, LeBlanc & Becker

[57] ABSTRACT

A lift-off process for removing a portion of a metal layer (4). The metal layer is formed on a dielectric polymer substrate with interposition of a corresponding portion of an intermediate layer (2). This process comprises the steps of selecting the material of the intermediate layer so that its interface with the metal has a low adhesivity; applying to the structure a mechanical stress causing detachment of the metal at the interface; and chemically removing the intermediate layer.

17 Claims, 2 Drawing Sheets

MECHANICAL LIFT-OFF PROCESS OF A METAL LAYER ON A POLYMER

This application is a continuation of application Ser. No. 07/658,633 filed Feb. 22, 1991, now abandoned.

The present invention relates to a lift off process and more particularly to such a process applied for depositing a metal layer in a recess or a groove formed in a dielectric polymer layer.

Chemical lift-off processes are known; they consist of selectively removing a portion of a deposit resulting from a physical (sputtering or evaporation) or chemical (chemical vapor deposition) process by positioning under the areas that are to be eliminated an intermediate layer soluble in a reagent.

Some steps of the conventional chemical lift-off process are illustrated in FIGS. 1-3 as part of a specific application wherein it is desired to fill grooves formed in a substrate.

One uses a substrate 1 on which an intermediate lift-off layer 2 is deposited. Then, as shown in FIG. 1, layer 2 is etched and grooves 3 are formed in substrate 1 so that portions of layer 2 overlay grooves 3.

During the next step, as shown in FIGS. 2A and 2B, the material intended to fill the grooves, usually a metal 4, is deposited. This material is deposited through a directional process so that it grows vertically. The example of FIG. 2A corresponds to an ideally directional deposition without deposition on the vertical walls of the pattern. It is for example the case of an aluminum deposition formed through vacuum evaporation when the solid angle of emission is small enough. FIG. 2B corresponds to a case where directivity is limited; it is for example the case of copper sputtering. In the latter case, the lateral edges of the lift off layer 2 are partially coated. To come back to the case of FIG. 2A, it is necessary to provide a preliminary non directional etching step which eliminates a superficial portion of the metal deposit.

Lastly, one chemically etches layer 2 which is eliminated while removing the over coated metal. For this purpose, the edges of layer 2 have to be exposed, as in the case of FIG. 2A. That is the reason why, in case of FIG. 2B, an etching step is provided to restore the case of FIG. 2A. Thus, one obtains the structure of FIG. 3 wherein grooves 3 are filled with metal 4.

This chemical lift-off process is commonly used for manufacturing integrated circuits but has a major drawback as regards the duration of the operation in case the areas to be eliminated occupy a large surface.

Layer 2 can be made of polysiloxane. In this case, a fluorhydric acid bath permits etching this layer under the metal layer 4 at a rate of about 10 micrometers per minute, that is, an etching period on the order of one hour for areas to be eliminated, having a surface of about 1 mm$^2$, a size that is conventional for the manufacture of interconnection arrays in integrated circuit chips.

To avoid some of the drawbacks of the chemical lift-off process, U.S. Pat. No. 4,871,651 provides a cryogenic lift-off process wherein, there is provided a layer of resist material in a desired pattern on a surface of a substrate, the substrate possessing a thermal coefficient of expansion different from that of said resist material, then a metal is deposited over the surface and the layered article is subjected to a temperature sufficiently low to cause the resist layer to detach from the surface of the substrate.

As indicated in the dependent of U.S. Pat. No. 4,871,651, the substrate is preferably a semiconductor and the lift-off layer a photoresist material. It is necessary that the substrate and the lift-off layer be dissimilar so that their thermal expansion coefficients are clearly different.

On the other hand, U.S. Pat. No. 4,448,636 describes a laser assisted lift-off process wherein a metal is deposited on a is locally coated with polymer. A laser beam radiation causes outgassing of the polymer at the interface with the metal and detachment of the metal. This process, which is based on decomposition of polymer, is complex to implement.

An object of the invention is to provide a lift-off process simple to implement with an insulating polymer substrate provided with grooves that are intended to be filled with a metal. In this case, the process according to U.S. Pat. No. 4,871,651 cannot be used because the differences in the thermal expansion coefficients between a polymer and the usual lift-off materials (resists, photoresists) is too low.

SUMMARY OF THE INVENTION

To attain this object and others, the invention provides a lift off process of a portion of a metal layer wherein this portion of metal layer is formed on a dielectric polymer substrate with interposition of a corresponding portion of an intermediate layer, comprising the steps of:

selecting the material of the intermediate layer to have a low adhesive interface with respect to the metal layer, applying to the structure a mechanical stress causing detachment at said interface, chemically removing the intermediate layer.

According to a variant of the invention, the intermediate layer comprises a sandwich of sublayers such that their interface has a low adherence.

According to an embodiment of the invention, the mechanical stress results from a thermal shock.

According to an embodiment of the invention, the intermediate layer is a polysiloxane, the substrate being a polyimide.

According to an embodiment of the invention, the first sublayer comprises a material such as a polysiloxane and the second sublayer comprises a metal, the materials of the two sublayers having distinct thermal expansion coefficients.

According to an embodiment of the invention, the mechanical removal step comprises the application of a jet of fluid.

According to an embodiment of the invention, the thermal shock results from annealing followed by cooling at ambient temperature, or, on the contrary, from immersion in liquid nitrogen followed by warming to ambient temperature.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1:
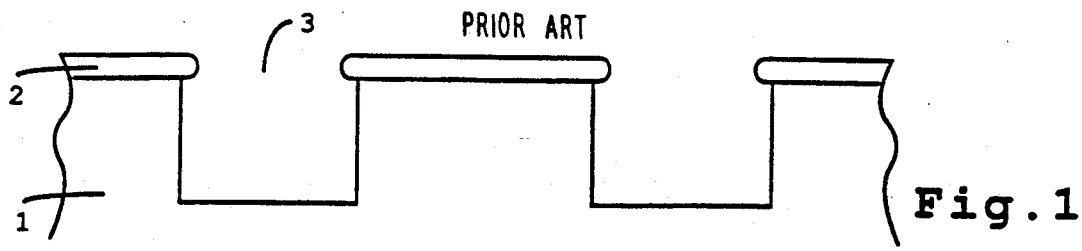
FIGS. 1, 2A, 2B and 3 are partial sectional diagrams illustrating the prior art.

The main steps of the invention can be described with reference to FIGS. 1-3 discussed above in connection the chemical lift off process of the prior art. The invention differs from the prior art in the method of selecting and eliminating the intermediate layer 2, and is directed to the case when the substrate (or the upper layer of a unit forming the substrate) is a dielectric polymer.

Figure 2A:
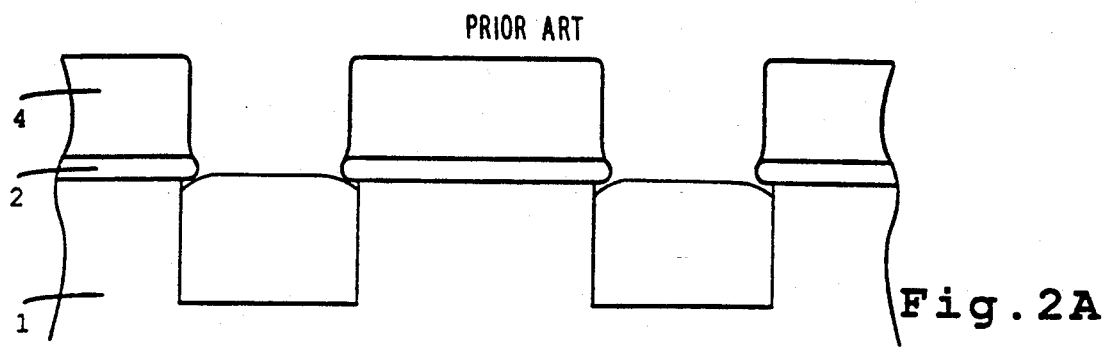
Figure 2B:
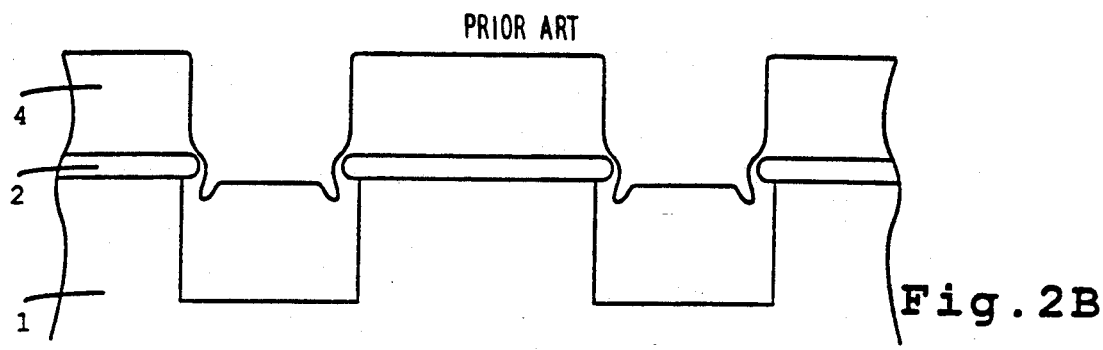

In case of a chemical lift-off process, the intermediate layer 2 is selected so as to be chemically etchable, selectively with respect to metal 4 and substrate 1. In U.S. Pat. No. 4,871,651, the intermediate layer is selected so as to have a coefficient of thermal expansion distinct from the one of the substrate. According to the invention, an intermediate layer 2 is selected, with a very low adherence property with the upper metal layer 4 so that a mechanical stress causes detachment of the metal layer. This mechanical stress can, for example result from a thermal shock. Thus, once the steps leading to the structure of FIG. 2A or FIG. 2B are performed, a thermal shock is produced, either through high temperature annealing (some hundreds degrees) followed by cooling to ambient temperature or, conversely, by hardening in liquid nitrogen followed by warming to ambient temperature. The mechanical stress resulting from the difference between the expansion coefficients of metal 4 and intermediate layer 2 causes detachment of metal at the low adhesive interface. Thus, the portion of layer 4 situated above the intermediate layer 2 is removed by thermal shock. This removal step can be enhanced by projecting a jet of fluid, for example compressed air.

It will be noted that this process does not imply that the edges of layer 2 be apparent and the thermal shock can be achieved with a structure similar to that of FIG. 2B without additional etching.

Figure 3:
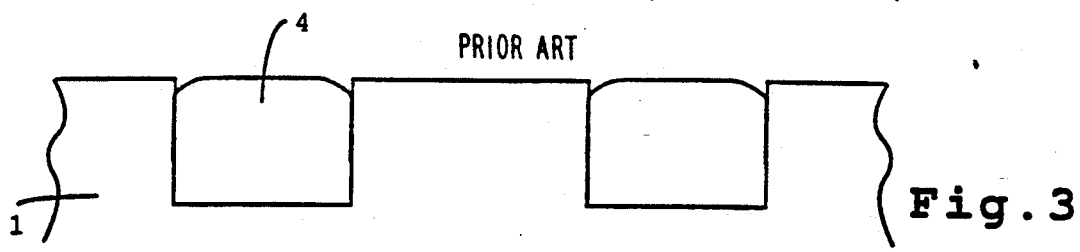

Then, the intermediate layer 2 is eliminated by selective chemical etching to form the structure of FIG. 3. This etching, performed perpendicularly to the layer laterally, (not laterally) can be performed rapidly.

In the inventive method, the intermediate layer 2 is selected so that its adherence with the metal layer 4, that will be subsequently deposited, is sufficiently low to cause detachment thereof after application of a mechanical stress such as the stress resulting from a thermal shock. Satisfactory tests have been performed by the inventors with a lift-off layer made of polysiloxane and a metal layer of tungsten or copper.

However, it may happen, for some metals or other specific materials, the elimination of which is to be achieved through lift off operation, that a material having a low adherence and that is easy to deposit is not available for implementing the process according to the invention. In that case, the invention provides, as illustrated in FIGS. 4-8, a composite intermediate layer constituted by a sandwich of at least two sublayers having a low mutual adherence.

Figure 4:
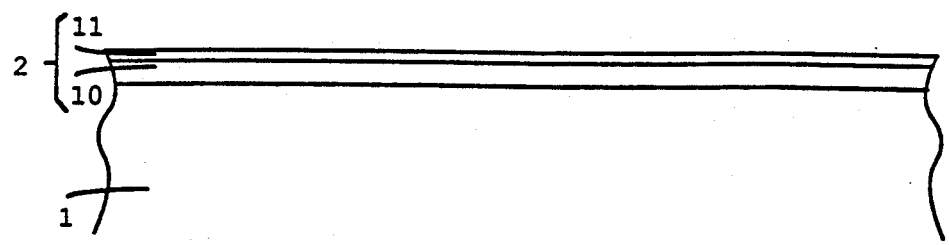
FIGS. 4-8 are partial sectional diagrams of a substrate illustrating of the process according to the invention.
Figure 5:
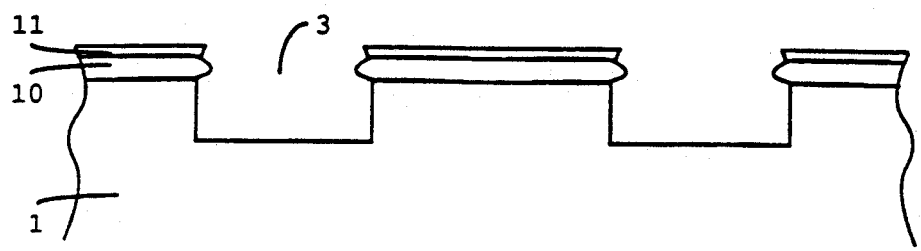
Figure 6:
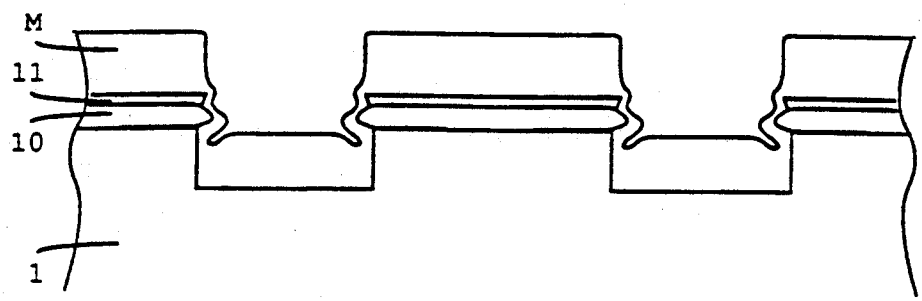

FIG. 4 shows an initial step implementing this variant of the process. On a substrate 1, the intermediate layer 2 comprises a sandwich, the lower layer 10 of which is for example made of polysiloxane and the upper layer 11 is for example made of copper. Then, as shown in FIG. 5, grooves 3 are etched, a portion at least of the sandwich 10, 11 protruding over the grooves. Then, a metal M is deposited, the grooves 3 of which are to be filled. FIG. 6 shows the case, similar to FIG. 2B, where this metal deposition is not perfectly directional and where the vertical edges of sandwich 10, 11 are partially coated.

Figure 7:
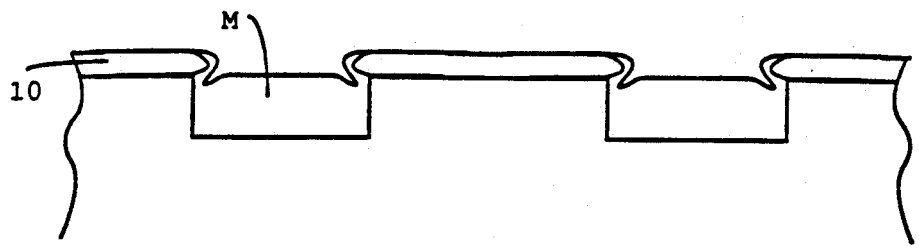
Figure 8:
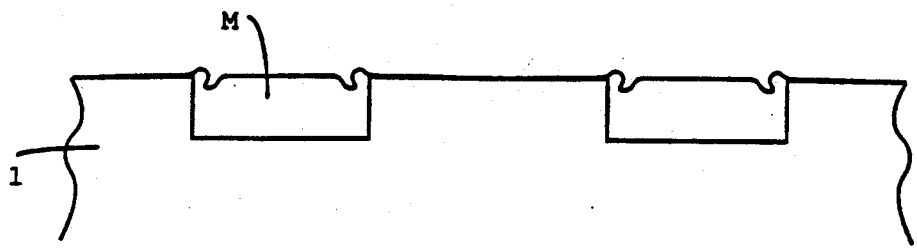

The structure shown in FIG. 7 is obtained by applying a thermal to the structure of FIG. 6 according to the invention. Then, layer 11 and the overlying metal are detached from layer 10 which remains in place and which is then eliminated through chemical etching as shown in FIG. 8.

Figure 9:
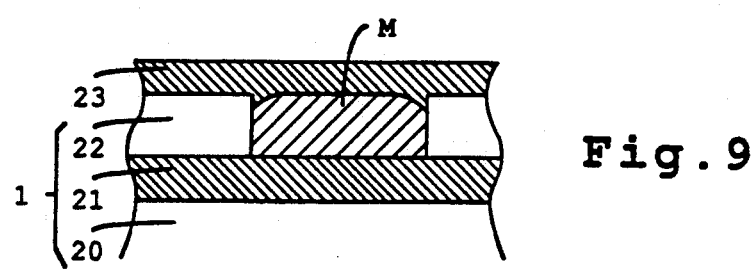
FIG. 9 shows an application of the lift-off process.

FIG. 9 shows a conventional use of the lift off process for achieving interconnections between connection lines. The structure 1 corresponds to a support 20 on which are formed parallel metal strips 21 coated with an insulator 22 such as a polyimide. This insulator 22 constitutes the substrate. Grooves 3 are formed in this insulator and the metal M which serves to fill these grooves and form interconnections is deposited by using the process according to the invention. A second metal layer 23, in contact through the metal interconnections with the metal underlayer 21, is then deposited and etched according to strips, by using the process according to the invention a second time.

The process according to the invention has been described in connection with the application of a thermal shock as a means for applying a mechanical stress for detaching two low layers having a low adherence. Other means such as the direct application of a jet of fluid, ultrasonic waves or a combination of these means, could be used.

We claim:

1. A lift-off process for removing a metal layer portion (4) wherein said metal layer portion is formed on a dielectric polymer substrate (1, 22) with intercalation of a corresponding portion of an intermediate layer (2), comprising the following steps:
   selecting the material of said intermediate layer to have a low adhesive interface with the metal layer,
   applying to the structure a mechanical stress causing detachment of said metal at said interface,
   chemically removing said intermediate layer.

2. A lift-off process according to claim 1, wherein said mechanical stress results from a thermal shock.

3. A process according to claim 2, wherein said intermediate layer is a polysiloxane, the substrate being a polyimide.

4. A lift-off process for removing a metal layer portion wherein said portion of metal layer is formed on a substrate with intercalation of a corresponding portion of an intermediate layer (2), comprising the steps of:
   forming said intermediate layer (2) by sandwiching first and second sublayers (10, 11), such that an interface thereof has a low adherence,
   applying to the intermediate layer a purely mechanical stress to produce a shearing action which directly results in detachment at said interface, and
   chemically removing the remaining sublayer.

5. A process according to claim 4, wherein the mechanical stress results from a thermal shock.

6. A process according to claim 4, wherein the first sublayer comprises a polysiloxane and the second sublayer comprises a metal.

7. A process according to claim 5, wherein the materials of the two sublayers have distinct thermal expansion coefficients.

8. A process according to claim 1, wherein the mechanical removal step comprises the application of a jet of fluid.

9. A process according to claim 2, wherein the thermal shock results from annealing followed by cooling down to ambient temperature.

10. A process according to claim 2, wherein the thermal shock results from immersion in liquid nitrogen followed by warming up to ambient temperature.

11. A process according to claim 4, wherein the mechanical removal step comprises the application of a jet of fluid.

12. A process according to claim 5, wherein the thermal shock results from annealing followed by cooling down to ambient temperature.

13. A process according to claim 5, wherein the thermal shock results from immersion in liquid nitrogen followed by warming up to ambient temperature.

14. A process of forming a metal channel in a dielectric polymer substrate comprising the steps of:
   forming a lower intermediate layer (10) on a major surface of the substrate (1);
   forming an upper intermediate layer (11) on an upper surface of said lower intermediate layer (10);
   forming a channel (3) through said upper and lower intermediate layers (10, 11) and into said substrate (1);
   depositing a metal (M) in said channel (3) and on an upper surface of said upper intermediate layer (11) laterally adjacent said channel (3);
   applying a purely mechanical stress to said upper and lower intermediate layers (10, 11) resulting in a shearing action whereby said upper intermediate layer (11) separates from said lower intermediate layer (10); and
   chemically etching said substrate to remove said lower intermediate layer (11).

15. The process according to claim 14, wherein said step of forming said lower intermediate layer (10) includes a step of depositing a photoresist film on said major surface of said substrate.

16. The process according to claim 14, wherein said step of depositing said lower intermediate layer (11) includes a step of depositing a metal on said lower intermediate layer (10).

17. The process according to claim 14, wherein said step of applying a mechanical stress includes steps of heating and cooling said upper and lower intermediate layers.

* * * * *